United States Patent [19]

Akse et al.

[11] Patent Number: 4,511,601
[45] Date of Patent: Apr. 16, 1985

[54] COPPER METALLIZATION FOR DIELECTRIC MATERIALS

[75] Inventors: James R. Akse, Canyon Country; Stanley A. Long, Valencia, both of Calif.

[73] Assignee: North American Philips Corporation, New York, N.Y.

[21] Appl. No.: 494,475

[22] Filed: May 13, 1983

[51] Int. Cl.³ .............................................. H05K 3/12
[52] U.S. Cl. ........................................ 427/79; 427/80; 427/88; 427/96; 427/376.2; 427/380
[58] Field of Search ...................... 427/96, 80, 88, 79, 427/376.2, 380

[56] References Cited

U.S. PATENT DOCUMENTS

| | | | |
|---|---|---|---|
| 2,993,815 | 7/1961 | Treptow | 117/212 |
| 3,902,102 | 8/1975 | Burn | 317/258 |
| 4,070,518 | 1/1978 | Hoffman | 428/209 |
| 4,122,232 | 10/1978 | Kuo | 428/323 |
| 4,130,854 | 12/1978 | Hertz | 361/304 |
| 4,140,817 | 2/1979 | Brown | 427/102 |
| 4,172,919 | 10/1979 | Mitchell | 428/209 |
| 4,246,625 | 1/1981 | Prakash | 361/321 |
| 4,271,232 | 6/1981 | Heiman et al. | 428/332 |
| 4,316,920 | 2/1982 | Brown et al. | 427/96 |
| 4,317,750 | 3/1982 | Provance et al. | 252/519 |
| 4,323,483 | 4/1982 | Rellick | 252/512 |

OTHER PUBLICATIONS

Marion, R. H. et al., "Non-Noble Termination Method for Chip Capacitors," *The International Journal for Hybrid Microelectronics*, vol. 5, No. 2, 1982, pp. 50–53.

*Primary Examiner*—John D. Smith
*Attorney, Agent, or Firm*—Marc D. Schechter

[57] ABSTRACT

A method of providing a copper metallization on a dielectric or semiconductive body, and a dielectric or semiconductive body having a metallization consisting essentially of copper. According to the method, a mixture of copper oxide powder and 0 to 15 weight percent reduction-resistant glass frit is dispersed in an organic vehicle and a solvent to produce a paste. The paste is applied to the body to provide a coating thereon. The coating is dried to remove the solvent, and then the coated body is fired in an oxidizing atmosphere at a temperature below the melting temperature of the glass frit to remove the organic vehicle. Finally, the coated body is fired a second time in an atmosphere which is reducing to the copper oxide but substantially nonreducing to the glass frit. The second firing is at a temperature from 700° to 1050° C. for from 120 to 15 minutes to convert the copper oxide to copper metal. The metallized body may comprise a reduction-resistant dielectric body and a metallization consisting essentially of copper, with no glass frit.

26 Claims, 1 Drawing Figure

COPPER METALLIZATION FOR DIELECTRIC MATERIALS

BACKGROUND OF THE INVENTION

The invention relates to a method of providing a copper metallization on a dielectric or semiconductive body. The invention also relates to a method of providing a copper metallization on a base metal electrode multilayer capacitor. The invention further relates to a metallized dielectric or semiconductive body.

Dielectric and semiconductive materials have many uses, particularly as electronic components. For example, dielectric ceramics having a perovskite structure make very good capacitors. Barium titanate and calcium zirconate ceramics are typically used for such purposes. Other oxides may also be used.

In electronic components made of dielectric or semiconductive materials, electrical connections to the components must be provided. These are typically provided in the form of metal electrodes, or metallizations, which are attached to the component body. Noble metals such as silver and palladium and alloys thereof make excellent electrodes due to their excellent electrical conductivities and due to their resistance to chemical oxidation. However, such electrodes are very expensive.

Alternatively, less expensive base metals may be used for metallizations on components. For example, conductive films made partially of nickel, cobalt, and copper have been made in the past. (See, e.g. U.S. Pat. No. 4,122,232.) Some of the considerations affecting the use of such base metal metallizations include their susceptibility to oxidation and the strength of the bond attaching the metallization to the dielectric. In the case of copper metallizations, additional problems include the difficulty and expense of obtaining an easily dispersible copper powder (that is, the difficulty and expense of attaching a molecule to the copper particle which will interact properly with the solvent system), and the maleability of the copper which makes it difficult to grind the copper into a powder form while controlling particle size, agglomeration and surface area.

A particularly novel approach which reduces some of the problems associated with the formation of copper metallizations is disclosed in U.S. Pat. No. 2,993,815 (Treptow). Treptow discloses a method of providing a copper metallization on a refractory substrate. First, a mixture of copper or copper oxide and reduction-resistant glass frit is suspended in a volatile medium to form a dispersion. This mixture is applied to a substrate, and the coated substrate is then fired in an oxidizing atmosphere to form a bond between the substrate, glass, and copper oxide. After oxidation, the coated substrate is fired in an atmosphere reducing to the copper oxide, so as to reduce the copper oxide to copper metal.

While the method disclosed by Treptow for producing copper metallizations is effective, it is a process requiring many steps. Moreover, the glass frit appears to create strains at the metallization-substrate interface due to (i) the creation of reaction zones where the glass frit tends to react with the ceramic body, and (ii) a mismatch between the thermal coefficients of the glass, the glass-substrate reaction zone, and the substrate. (See, e.g. "Non-Noble Termination Method for Chip Capacitors," R. H. Marion et al., *The International Journal For Hybrid Microelectronics*, Vol. 5, No. 2, 1982, pp. 50–53.) These strains sometimes result in cracks in the dielectric upon thermal cycling. Additionally, the glass frit is vulnerable to chemical attack which may occur during subsequent processing of the component. For example, if the metallized component is electroplated to provide a solderable terminal, the electroplating may chemically attack the glass frit in the metallization.

SUMMARY OF THE INVENTION

It is an object of the invention to provide a simple and inexpensive method of applying a copper metallization to a dielectric or semiconductive body.

It is another object of the invention to provide a method of applying a copper metallization to a dielectric or semiconductive body in which a paste having good rheological properties is applied to the body.

It is a further object of the invention to provide a method of producing a fritless copper metallization on a dielectric or semiconductive body such that the body will have a reduced susceptibility to cracking.

It is yet another object of the invention to provide a fritless copper metallization on a dielectric or semiconductive body.

It is still a further object of the invention to provide a high density metallization with good electrical properties, good substrate contact, which is inexpensive as compared to noble metal metallizations, and which is solderable.

According to the invention, a method of providing a copper metallization on a dielectric or semiconductive body consists essentially of the steps of mixing copper oxide powder and up to 15 weight percent reduction-resistant glass frit, dispersing the mixture in an organic vehicle and a solvent to produce a paste, and applying the paste to the body to provide a coating thereon. This is followed by drying the coating to remove the solvent, firing the coated body in an oxygen atmosphere at a temperature below the melting temperature of the glass frit to remove all or part of the organic vehicle, and firing the coated body a second time in an atmosphere which is reducing to the copper oxide. The second firing is at a temperature from 700° to 1050° C. for from 120 to 5 minutes. The second firing is effective to convert the copper oxide to copper metal.

According to another aspect of the invention, a method of providing a copper metallization on a dielectric or semiconductive body consists essentially of the steps of providing a copper oxide powder with no glass frit, dispersing the copper oxide powder in an organic vehicle and a solvent to produce a paste, and applying the paste to the body to provide a coating thereon. This is followed by drying the coating to remove the solvent, firing the coated body in an oxidizing atmosphere to remove all or part of the organic vehicle, and firing the coated body a second time in an atmosphere which is reducing to the copper oxide. The second firing is at a temperature from 700° to 1050° C. for from 120 to 15 minutes, so as to convert the copper oxide to copper metal.

According to yet another aspect of the invention, a method of providing a copper metallization on a base metal electrode multilayer capacitor consists essentially of the steps of mixing copper oxide powder and 0 to 15 weight percent reduction-resistant glass frit, dispersing the mixture in an organic vehicle and a solvent to produce a paste, and applying the paste to the multilayer capacitor, to provide a coating thereon. This is followed by drying the coating to remove the solvent, firing the coated multilayer capacitor in an oxidizing atmosphere at a temperature below the melting temperature of the glass frit to remove all or part of the organic vehicle, and firing the coated multilayer capacitor a second time in an atmosphere which is reducing to the copper oxide. The second firing is at a temperature from 700° to 1050° C. for from 120 to 15 minutes. The second firing is effective to convert the copper oxide to copper metal.

In another aspect of the invention, a metallized body comprises a reduction-resistant dielectric body and a metallization consisting essentially of copper.

In all aspects of the invention, the metallized body is preferably a ceramic having a perovskite structure. Such a ceramic may comprise, for example, barium titanate, calcium zirconate, strontium titanate, or strontium zirconate.

Moreover, the organic vehicle is preferably removed from the coated body by firing at a temperature of from 200° to 450° C. in air. The second firing step is preferably performed in a reducing atmosphere having a partial oxygen pressure less than $9.5 \times 10^{-6}$ atmospheres.

Preferably, the reduction-resistant glass frit consists essentially of oxides of (i) barium, boron, and aluminum, (ii) sodium, boron, and silicon, or (iii) lead, boron, and silicon.

In those embodiments of the invention in which a glass frit is used, preferably the second firing is in an atmosphere which is substantially nonreducing to the glass frit, at least for the duration of the second firing.

The invention is advantageous because the copper oxide-based paste is easily dispersed with conventional dispersing agents. Moreover, the physical properties of the copper oxide powder can be easily manipulated by conventional milling techniques. Finally, the inventive method produces a copper metallization with fewer steps and, in one embodiment, with no glass frit.

DESCRIPTION OF THE PREFERRED EMBODIMENTS

Figure 1:
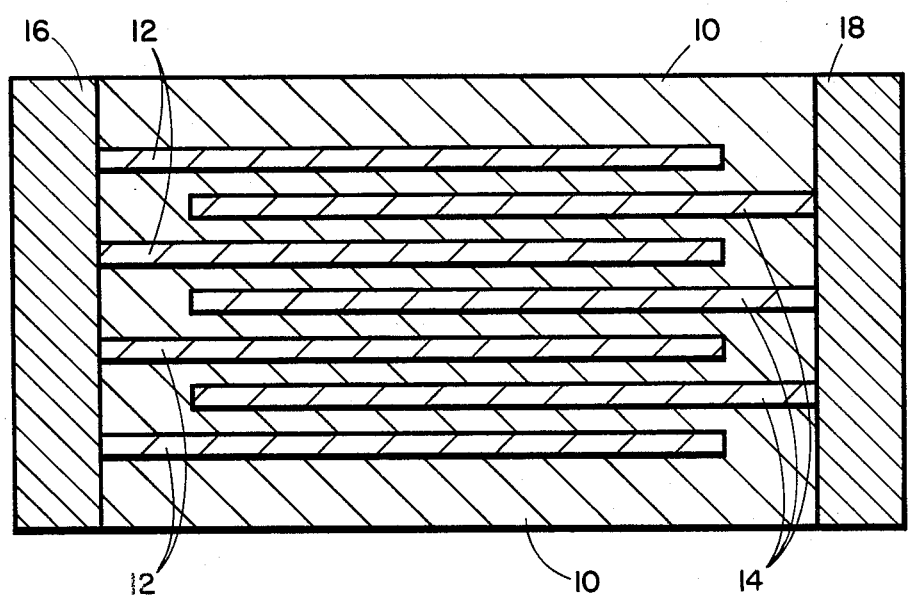
FIG. 1 is a cross-sectional view of a metallized multilayer capacitor according to the invention.

Copper metallizations according to the present invention are manufactured in the following manner. Copper oxide (cuprous or cupric) powder is mixed with a reduction-resistant glass frit. Preferably, both the powder and the frit are ground to subsieve minus 325. The reduction-resistant glass frit comprises 0-15 weight percent of the mixture. For the purpose of the invention, reduction-resistant glass frit (defined further below) means both reduction-resistant and nonreducible glass frit.

After the copper oxide/glass frit mixture is prepared, or simultaneously with the preparation thereof, the copper oxide and glass frit are dispersed (with a dispersing agent such as Duomeen C TM in kerosene) in an organic vehicle to form a paste. Many organic vehicles are available, for example ethyl cellulose in terpinol or cellusolve acetate. The viscosity of the paste may be adjusted with a solvent to achieve the consistency needed for applying the paste to a dielectric body. Suitable solvents include cellusolve acetate and butyl cellusolve acetate.

The next step in the process is applying the paste to the dielectric or semiconductive body to form a coating on the body. Typically the paste is applied by dipping, but it may alternatively be applied by screen printing. In these well know methods of forming thick films, the viscosity of the paste is an important process parameter for obtaining high quality metallizations.

The dielectric or semiconductive body on which the paste is applied may be many materials. By way of example (but not limitation), the body may be an oxidic ceramic having a perovskite structure. This class of materials, which includes barium titanate and calcium zirconate, is known for materials having large dielectric constants. These materials are useful, for example, in the manufacture of ceramic capacitors.

After the dielectric or semiconductive body is coated, it is allowed to dry to remove the solvent from the paste. Thereafter, the coated body is fired in an oxidizing atmosphere to remove all or part of the organic vehicle, leaving only the copper oxide and glass frit (if any) remaining. When the coating has glass frit therein, the firing temperature in this step is below the melting or softening temperature of the glass frit. Preferrably, to remove the organic vehicle the firing temperature is from 200° to 450° C. and the firing is in air.

Finally, after the organic vehicle is burned out of the coating, the coated body is fired a second time, this time in an atmosphere which is reducing to the copper oxide. Preferably, the second firing is at a temperature from 700° to 1050° C. for from 120 to 15 minutes (the higher the firing temperature, the shorter the firing time), and is in an atmosphere which is substantially nonreducing to the glass frit (if any) at least for the duration of the second firing. The partial oxygen pressure of the firing atmosphere is preferably less than $9.5 \times 10^{-6}$ atmospheres depending on the firing temperature.

It is during this final firing step that the copper metallization is formed by reducing the copper oxide to copper metal. At the same time, it has been discovered that a bond, affixing the copper metallization to the dielectric or semiconductive body is formed. This bond is formed with or without the presence of glass frit. While the bond appears to be stronger with glass frit, the body appears less susceptible to cracking when provided with a fritless metallization.

A noteworthy feature of the method according to the invention is the discovery that in the fritted metallization it is not necessary to provide an additional firing step (between the organic vehicle removal and the final reduction firing) at a temperature above the melting temperature of the glass frit to commence formation of a bond between the substrate, glass, and copper oxide.

As discussed above, during the second firing according to the invention, the firing atmosphere is reducing to the copper oxide but preferably not to the glass frit, if any frit is used. This requirement functionally defines the reduction-resistant glass frit. That is, a reduction-resistant glass frit is one which can withstand firing in an atmosphere which is reducing to the copper oxide used. Such glass frits (oxides of various elements) will either (i) reach equilibrium with their elemental constituent at very low concentrations of the pure elements, or (ii) proceed toward equilibrium with their pure elements very slowly in comparison to the firing time in the reducing atmosphere so that only a small conversion from oxide to pure element takes place, or both (i) and (ii) will hold true.

Suitable glass frits for use in the invention include nonreducible $BaO-B_2O_3-Al_2O_3$ systems such as 5–65 weight percent $BaO$, 0–35 weight percent $Al_2O_3$, and 25–85 weight percent $B_2O_3$, with up to 5 weight percent Na$_2$O or K$_2$O substituted for BaO, up to 15 weight percent MgO, CaO, or SrO substituted for BaO, up to 50 weight percent SiO$_2$ substituted for B$_2$O$_3$, and up to 5 weight percent ZnO, NiO or CuO substituted for BaO. A preferred glass frit in this system consists essentially of 60 weight percent BaO, 33.5 weight percent B$_2$O$_3$, 5 weight percent Al$_2$O$_3$, and 1.5 weight percent Na$_2$O.

Another suitable nonreducible system is the Na$_2$O-B$_2$O$_3$-SiO$_2$ system, such as 25–55 weight percent B$_2$O$_3$, 0–10 weight percent Na$_2$O, and 35–75 weight percent SiO$_2$, with up to 5 weight percent K$_2$O substituted for Na$_2$O. A preferred frit in this system consists essentially of 38.3 weight percent B$_2$O$_3$, 7.7 weight percent Na$_2$O, and 54 weight percent SiO$_2$.

A reduction-resistant glass system suitable for use in the invention is the PbO-B$_2$O$_3$-SiO$_2$ system including glasses such as 50–80 weight percent PbO, 15–25 weight percent SiO$_2$-15 weight percent B$_2$O$_3$, 0–5 weight percent Al$_2$O$_3$, 0–5 weight percent Na$_2$O, and 0–4 weight percent TiO$_2$. A preferred composition within the system consists essentially of 63 weight percent PbO, 15.4. weight percent SiO$_2$, 15 weight percent B$_2$O$_3$, 0–6 weight percent Al$_2$O$_3$, 2 weight percent Na$_2$O, and 4 weight percent TiO$_2$.

The method according to the present invention and the metallization according to the invention are particularly suitable for use in connection with the production of base metal electrode multilayer capacitors. FIG. 1 shows a cross-section through such a device. The base metal electrode capacitor depicted in FIG. 1 is made up of layers 10 of a dielectric or semiconductive material separated by layers 12 and 14 of base metal electrodes. The structure is built up by stacking layers of electroded green ceramics and then firing the layered structure at a high temperature to densify the ceramic. So as not to oxidize the base metal electrodes, the structure is fired in a reducing atmosphere. Consequently, the dielectric must be a reduction-resistant ceramic.

As can be seen in FIG. 1, the electrodes 12 and 14 do not extend completely across the dielectric layers 10. Each electrode 12 extends to one side of the ceramic (the left side of FIG. 1), while each alternate electrode 14 extends to the other side of the dielectric (the right side of FIG. 1). All of the electrodes 12 can be electrically connected together, and at the same time all the electrodes 14 can be electrically connected together to form a network of capacitors electrically connected in parallel. These connections are accomplished with metallizations 16 and 18 according to the invention. The device so constructed can now be provided with leads (not shown) soldered onto metallizations 16 and 18.

Use of the method and metallization according to the invention with base metal electrode multilayer capacitors is advantageous because the firing of the coated body in a reducing atmosphere to produce the metallization will damage neither the internal base metal electrodes or the reduction-resistant ceramic.

EXAMPLES

Table 1, below, shows several examples of dielectric bodies provided with copper metallizations according to the invention. Also shown in Table 1 are comparative examples not made according to the invention.

In all of the examples, the dielectric body was a modified barium titanate. The electrode paste was applied by doctor-blading a thin layer of paste onto a substrate, and then dipping the dielectric body into the layer of paste. Except as noted, the coated dielectric body was fired to burn off the organic vehicle and was then fired at a peak temperature of 940° C. for 5 minutes. The atmosphere of the second firing is given in Table 1.

TABLE 1

| Base for Electrode Paste | Firing Atmosphere (% H$_2$ in N$_2$ with 30° C. dewpoint) | Pull Test (lbs.) | Solderability | Remarks |
| --- | --- | --- | --- | --- |
| Cu$_2$O | 0.2% | 10.8 | Excellent | 2 |
| Cu$_2$O | 0.2% | 6.0 | Excellent | 1,2 |
| Cu$_2$O | 0.2% | 10.9 | Excellent | 2,4 |
| Cu$_2$O | 0.2% | 7.3 | Excellent | 2,3 |
| CuO | 0.1% | 10.0 | Excellent | |
| CuO | 0.1% | 8.7 | Excellent | 4 |
| Cu | 0.6% | 6.4 | Excellent | |
| Cu | 0.6% | 1.4 | Excellent | 1 |

Remarks for Table 1
1 Ceramic chip had no inner electrodes.
2 No separate firing to burn off the organic vehicle.
3 The electrode paste included a glass having the composition, in weight percent: 63 PbO, 15.4 SiO$_2$, 0.6 Al$_2$O$_3$, 15.0 B$_2$O$_3$, 2.0 Na$_2$O, and 4.0 TiO$_2$.
4 The electrode paste included a glass having the composition, in weight percent: 59.8 BaO, 5.22 Al$_2$O$_3$, 33.51 B$_2$O$_3$, and 1.47 Na$_2$O.

The pull test, whose results are reported in Table 1, was an axial pull test. The number reported in the Table is the force in pounds recorded at separation of the metallization from the substrate. The solderability reported in Table 1 is a subjective evaluation, based on observations that in each case the entire termination was easily wettable by 60–40 (tin-lead) solder, with no appreciable bare spots.

In addition to the principal disadvantages of using a copper metal-based electrode paste (the difficulty and expense of obtaining an easily dispersible copper powder with a well defined particle size, degree of agglomeration, and surface area), Table 1 illustrates that the copper metal-based paste does not form as strong a bond as the copper oxide-based pastes.

What is claimed is:

1. A method for providing a copper metallization on a dielectric or semiconductive body, said method consisting essentially of the steps of:
   providing copper oxide powder;
   providing a reduction-resistant glass frit having a melting temperature;
   mixing the copper oxide powder and the glass frit to produce a mixture having at most 15 weight percent glass frit;
   dispersing the mixture in an organic vehicle and a solvent for the organic vehicle to produce a paste;
   applying the paste to the body to provide a coating thereon;
   drying the coating to remove the solvent;
   firing the coated body a first time in an oxidizing atmosphere at a temperature below the melting temperature of the glass frit to remove at least a portion of the organic vehicle, said first firing producing substantially no adhesion between the paste and the body; and
   firing the coated body a second time after the first firing, the second firing being in an atmosphere which is reducing to the copper oxide, said second firing being at a temperature from 700° to 1050° C. for from 120 to 15 minutes to convert the copper oxide to copper metal and to form a bond between the copper metal and the body.

2. A method as claimed in claim 1, characterized in that the body is a ceramic having a perovskite structure.

3. A method as claimed in claim 2, characterized in that the body comprises barium titanate.

4. A method as claimed in claim 3, characterized in that the first firing is at a temperature of from 200° to 450° C.

5. A method as claimed in claim 4, characterized in that in the second firing step the partial oxygen pressure of the firing atmosphere is less than $9.5 \times 10^{-6}$ atmospheres.

6. A method as claimed in claim 5, characterized in that the powder and the frit particles are subsieve minus 325.

7. A method as claimed in claim 6, characterized in that the glass frit consists essentially of oxides of barium, boron, and aluminium.

8. A method as claimed in claim 6, characterized in that the glass frit consists essentially of oxides of sodium, boron, and silicon.

9. A method as claimed in claim 6, characterized in that the glass frit consists essentially of oxides of lead, boron, and silicon.

10. A method as claimed in claim 6, characterized in that the second firing is in an atmosphere which is substantially nonreducing to the glass frit, at least for the duration of the second firing.

11. A method of providing a copper metallization on a dielectric or semiconductive body, said method consisting essentially of the steps of:
    providing a powder consisting essentially of copper oxide;
    dispersing the copper oxide powder in an organic vehicle and a solvent for the organic vehicle to produce a paste;
    applying the paste to the body to provide a coating thereon;
    drying the coating to remove the solvent;
    firing the coated body a first time, said first firing being in an oxidizing atmosphere to remove the organic vehicle, said first firing producing substantially no adhesion between the paste and the body; and
    firing the coated body a second time after the first firing, the second firing being in an atmosphere which is reducing to the copper oxide, said second firing being at a temperature from 700° to 1050° C. for from 120 to 15 minutes to convert the copper oxide to copper metal and to form a bond between the copper metal and the body.

12. A method as claimed in claim 11, characterized in that the body is a ceramic having a perovskite structure.

13. A method as claimed in claim 12, characterized in that the body comprises barium titanate.

14. A method as claimed in claim 13, characterized in that the first firing is at a temperature of from 200° to 450° C.

15. A method as claimed in claim 14, characterized in that in the second firing step the partial oxygen pressure of the firing atmosphere is less than $9.5 \times 10^{-6}$ atmospheres.

16. A method as claimed in claim 15, characterized in that the powder is subsieve minus 325.

17. A method of providing a copper metallization on a base metal electrode mulitlayer capacitor, said method consisting essentially of the steps of:
    providing a multilayer capacitor consisting essentially of alternate layers of a reduction-resistant dielectric and a base metal electrode;
    providing copper oxide powder;
    providing a reduction-resistant glass frit having a melting temperature;
    mixing the copper oxide powder and the glass frit to produce a mixture having, 0–15 weight percent glass frit;
    dispersing the mixture in an organic vehicle and a solvent for the organic vehicle to produce a paste;
    applying the paste to the capacitor to provide a coating thereon;
    drying the coating to remove the solvent;
    firing the coated capacitor a first time in an oxidizing atmosphere at a temperature below the melting temperature of the glass frit to remove the organic vehicle, said first firing producing substantially no adhesion between the paste and the body, the temperature of the first firing being in a range where there is no substantial oxidation of the base metal electrodes; and
    firing the coated capacitor a second time after the first firing, the second firing being in an atmosphere which is reducing to the copper oxide, said second firing being at a temperature from 700° to 1050° C. for from 120 to 15 minutes to convert the copper oxide to copper metal and to form a bond between the copper metal and the body.

18. A method as claimed in claim 17, characterized in that the dielectric is a ceramic having a perovskite structure.

19. A method as claimed in claim 18, characterized in that the dielectric comprises barium titanate.

20. A method as claimed in claim 19, characterized in that the first firing is at a temperature of from 200° to 450° C.

21. A method as claimed in claim 20, characterized in that in the second firing step the partial oxygen pressure of the firing atmosphere is less than $9.5 \times 10^6$ atmospheres.

22. A method as claimed in claim 21, characterized in that the powder and the frit particles are subsieve minus 325.

23. A method as claimed in claim 22, characterized in that the second firing is in an atmosphere which is substantially nonreducing to the glass frit, at least for the duration of the second firing.

24. A method as claimed in claim 22, characterized in that the glass frit consists essentially of oxides of barium, boron, and aluminum.

25. A method as claimed in claim 22, characterized in that the glass frit consists essentially of oxides of sodium, boron, and silicon.

26. A method as claimed in claim 22, characterized in that the glass frit consists essentially of oxides of lead, boron, and silicon.

* * * * *